US011342915B1

(12) United States Patent
Ross

(10) Patent No.: US 11,342,915 B1
(45) Date of Patent: May 24, 2022

(54) COLD SPARE TOLERANT RADIATION HARDENED GENERIC LEVEL SHIFTER CIRCUIT

(71) Applicant: BAE SYSTEMS Information and Electronic Systems Integration Inc., Nashua, NH (US)

(72) Inventor: Jason F. Ross, Haymarket, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 17/173,870

(22) Filed: Feb. 11, 2021

(51) Int. Cl.
*H03K 19/00* (2006.01)
*H03K 19/0175* (2006.01)
*H03K 19/0185* (2006.01)

(52) U.S. Cl.
CPC .......................... *H03K 19/018521* (2013.01)

(58) Field of Classification Search
None
See application file for complete search history.

(56) References Cited

U.S. PATENT DOCUMENTS

| 4,130,892 A | 12/1978 | Gunckel, II et al. |
| 4,434,459 A | 2/1984 | Holland |
| 5,117,129 A | 5/1992 | Hoffman |
| 5,438,437 A | 8/1995 | Sasaki |

(Continued)

FOREIGN PATENT DOCUMENTS

| EP | 0432846 A1 | 6/1991 |
| WO | 2008118553 A2 | 10/2008 |
| WO | 2008140643 A2 | 11/2008 |

OTHER PUBLICATIONS

Lapedus; Mark, The Chiplet Race Begins, Semiconductor Engineering, Aug. 6, 2018, https://semiengineering.com/the-chiplet-race-begins/, 13 pages.

(Continued)

*Primary Examiner* — Kenneth B Wells
(74) *Attorney, Agent, or Firm* — Maine Cernota & Rardin; Gary McFaline

(57) ABSTRACT

A level shifting circuit, the circuit comprising a VL input; an I/O VL; a VCC input; an I/O VCC; a first pull-up resistor disposed between the VL input and I/O VL; a second pull-up resistor disposed between the VCC input and I/O VCC; a first pull-up assist circuit comprising a first pull-up assist p-channel MOSFET having a source/body, drain, and gate, the source/body and drain being connected to VL and I/O VL; a second pull-up assist circuit comprising a second pull-up assist p-channel MOSFET having a source/body, drain, and gate, the source/body and drain being connected to VCC and I/O VCC, respectively; a pass-gate n-channel MOSFET in operative communication with I/O VL, I/O VCC, and VL, the pass-gate being configured to reduce the voltage level of a signal driven from I/O VCC to the voltage level of I/O VL; and a one-shot circuit configured to detect a I/O VL or I/O VCC transition from a low state to a high state, to produce a pulse in response thereto, and to communicate that pulse to the gates of the first and second pull-up assist p-channel MOSFETs, wherein the second pull-up resistor is configured to increase the voltage level of a signal driven from I/O VL to the voltage level of I/O VCC.

9 Claims, 6 Drawing Sheets

(56) References Cited

U.S. PATENT DOCUMENTS

| | | | |
|---|---|---|---|
| 5,629,634 | A | 5/1997 | Carl |
| 5,867,039 | A | 2/1999 | Goike |
| 5,907,865 | A | 5/1999 | Moyer |
| 6,111,780 | A | 8/2000 | Bertin |
| 6,311,258 | B1 | 10/2001 | Gibson |
| 6,845,054 | B2 | 1/2005 | Lovett |
| 6,914,470 | B2 * | 7/2005 | Watanabe ...... H03K 19/018521 326/81 |
| 7,355,447 | B2 | 4/2008 | Wood et al. |
| 7,408,410 | B2 | 8/2008 | Wood |
| 7,667,519 | B2 * | 2/2010 | Welty ................. H03K 17/162 327/333 |
| 7,928,766 | B2 * | 4/2011 | Welty ............ H03K 19/018592 326/68 |
| 8,487,649 | B2 | 7/2013 | Konishi |
| 8,778,755 | B2 | 7/2014 | Ross |
| 8,975,920 | B2 | 3/2015 | Bansal |
| 8,977,933 | B2 | 3/2015 | Cloetens |
| 10,135,443 | B1 | 11/2018 | Ross |
| 10,181,852 | B1 * | 1/2019 | Tiwari ............. H03K 19/00361 |
| 10,566,975 | B1 * | 2/2020 | Tiwari ........... H03K 19/018507 |
| 10,624,246 | B2 | 4/2020 | Li et al. |
| 10,659,051 | B1 * | 5/2020 | Tiwari ........... H03K 19/018592 |
| 10,700,046 | B2 | 6/2020 | Rickard et al. |
| 10,854,586 | B1 | 12/2020 | Dennis et al. |
| 2002/0024098 | A1 | 2/2002 | Eimori |
| 2003/0020160 | A1 | 1/2003 | Deeney |
| 2007/0285851 | A1 | 12/2007 | Hillman et al. |
| 2010/0039030 | A1 | 2/2010 | Winters et al. |
| 2012/0212465 | A1 | 8/2012 | White |
| 2017/0316829 | A1 | 11/2017 | Ehrman |
| 2019/0221556 | A1 | 7/2019 | Gomes |
| 2019/0311765 | A1 | 10/2019 | Lin |
| 2020/0051961 | A1 | 2/2020 | Rickard et al. |

OTHER PUBLICATIONS

Mutschlir; Ann Steffora, DARPA CHIPS Program Pushes for Chiplets, Semiconductor Engineering, Sep. 14, 2017, https://semiengineering.com/darpa-chips-program-pushes-for-chiplets/, 6 pages.

European Search Report for Appl. No. 08794298, dated Oct. 25, 2010, 2 pages.

European Search Report for Appl. No. 08780420, dated Oct. 27, 2010, 4 pages.

Notice of Allowance dated Jun. 17, 2020 for U.S. Appl. No. 16/422,072, 28 Pages.

Office Action for U.S. Appl. No. 16/425,377, dated Sep. 2, 2020, 36 Pages.

Notice of Allowance for U.S. Appl. No. 16/425,377, dated Mar. 5, 2021, 15 Pages.

M. Zhou, L. Xiao, S. Li and Y. Zhang, "Efficient Two-Dimensional Error Codes for Multiple Bit Upsets Mitigation in Memory," 2010 IEEE 25th International Symposium on Defect and Fault Tolerance in VLSI Systems, Kyoto, Japan, 2010, pp. 129-135, doi: 10.1109/DFT.2010.22. (Year: 2010).

* cited by examiner

COLD SPARE TOLERANT RADIATION HARDENED GENERIC LEVEL SHIFTER CIRCUIT

FIELD OF THE DISCLOSURE

The following disclosure relates generally to circuit design and, more specifically, to radiation hardened level shifter circuits.

BACKGROUND

A level shifter in digital electronics, which may also be referred to as a logic-level shifter circuit or voltage level translation circuit, is a circuit used to translate signals from one logic level or voltage domain to another, allowing compatibility between Integrated Circuits (ICs) with different voltage requirements, such as Transistor-Transistor Logic (TTL) and Low Voltage Complementary Metal-Oxide-Semiconductor (LVCMOS) circuits. Modern systems use level shifters to bridge domains between processors, logic, sensors, and other circuits. In recent years, the three most common logic levels have been 1.8V, 3.3V, and 5V, though levels above and below these voltages are also used. As level shifters are used to resolve the voltage incompatibility between various parts of a system, they have a wide range of applications and play critical roles therein.

While many designs for level shifter circuits exist, no current design is cold spare tolerant (a cold spare being a component, such as an Integrated Circuit (IC), that resides within a computer system in an unpowered state, but requires manual intervention to activate in the event of a component failure), radiation hardened (i.e. tolerant to high levels of ionizing radiation), and compatible with push-pull and open drain signal types. Cold spare tolerance and radiation hardening are particularly desirable characteristics where there is a great need for redundancy and a high amount of ionizing radiation is likely to be encountered during use, which includes environments such as outer space and high-altitude flight, around nuclear reactors and particle accelerators, and systems that may be used during nuclear accidents or nuclear warfare.

Furthermore, most current push-pull and open drain signaling compatible level shifter designs allow operation only at relatively low frequencies (e.g. below 2 MHz). A level shifter with increased frequency handling capability would provide for easier use and integration with existing IC designs.

Also, many level shifter circuits are bi-directional (inputs can become outputs and vice-versa) and utilize external direction control inputs to swap between the two configurations. Essentially, upon a change in an external signal, the inputs become outputs and the outputs become inputs. While this design is functional, the requirement for an external direction control(s) complicates system design. A bi-directional level shifter that did not require an external input to change directions would ease system design while reducing costs due to the omission of the circuit configured to provide the external signal required by current designs.

Lastly, digital ICs with which a level shifter circuit may be interfaced generally have two output signaling options—push-pull and open drain. A push-pull output, which is also referred to as a "totem pole" output, provides an unambiguous voltage output signal that is actively driven to either the logic high or logic low level. Examples of I/O standards that leverage Push-Pull output drivers are Low Voltage Complementary Metal-Oxide-Semiconductor (LVCMOS) and Transistor-Transistor Logic (TTL).

For certain applications, however, an open drain configuration may be more useful. An open drain output provides a voltage output signal that is actively driven to the logic low level but passively driven to the logic high level via a pull-up resistor. Open drain signaling allows multiple output drivers to share a signal wire without the possibility of bus contention (i.e. multiple outputs driving simultaneously to opposite logic states) as all outputs are only capable of actively driving to the logic low level. The Inter-Integrated Circuit ($I^2C$) protocol utilizes open drain signaling.

What is needed, therefore, is a cold spare tolerant, radiation hardened level shifter circuit that is compatible with push-pull and open drain signal types to ensure wide compatibility with current circuits and that supports auto-sensing of signal direction without the need for a dedicated external direction control input.

SUMMARY

Novel level-shifting circuit designs that include cold spare tolerance and radiation hardening by design techniques are herein disclosed. The level shifter circuit topology of embodiments does not require direction control input signals.

Embodiments support IC I/O interfaces operating at frequencies below 2 MHz in addition to higher operating frequencies. A higher performance design, relative to currently-available circuits, renders the circuit easier to use and integrate with existing IC designs.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

Figure 1:
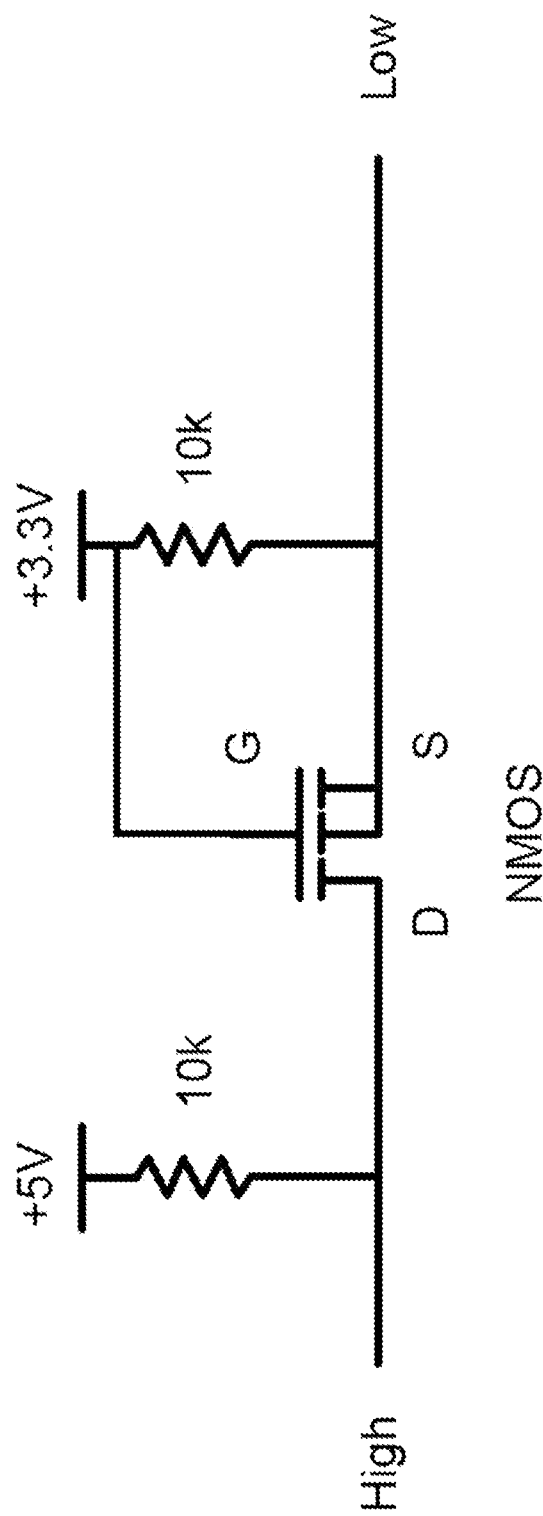
FIG. 1 is a schematic depicting a prior art, bi-directional level shifter circuit.

FIG. 1 is a schematic describing a bi-directional, prior art level shifter circuit. The circuit uses an NMOS transistor configured as a pass-gate and two pull-up resistors to translate between the high voltage (+5V) and low voltage (+3.3V) power domains. When the high voltage (+5V) side of the NMOS transistor is driven to logic1, the low voltage (+3.3V) side of the NMOS transistor is driven to the gate voltage of the NMOS transistor minus the threshold voltage of the NMOS transistor (~+2.6V). The low voltage (+3.3V) side of the NMOS transistor is fully restored to the low voltage (+3.3V) supply level by the associated pull-up resistor. When the high voltage (+5V) side of the NMOS transistor is driven to logic0, the low voltage (+3.3V) side of the NMOS transistor is also driven to logic0 due to the NMOS pass-gate configuration.

Similarly, when the low voltage (+3.3V) side of the NMOS transistor is driven to logic1, the high voltage (+5V) side of the NMOS transistor is driven to the gate voltage of the NMOS transistor minus the threshold voltage of the NMOS transistor (~+2.6V). The high voltage (+5V) side of the NMOS transistor is fully restored to the high voltage (+5V) supply level by the associated pull-up resistor. When the low voltage (+3.3V) side of the NMOS transistor is driven to logic0 the high voltage (+5V) side of the NMOS transistor is also driven to logic0 due to the NMOS pass-gate configuration.

Figure 2:
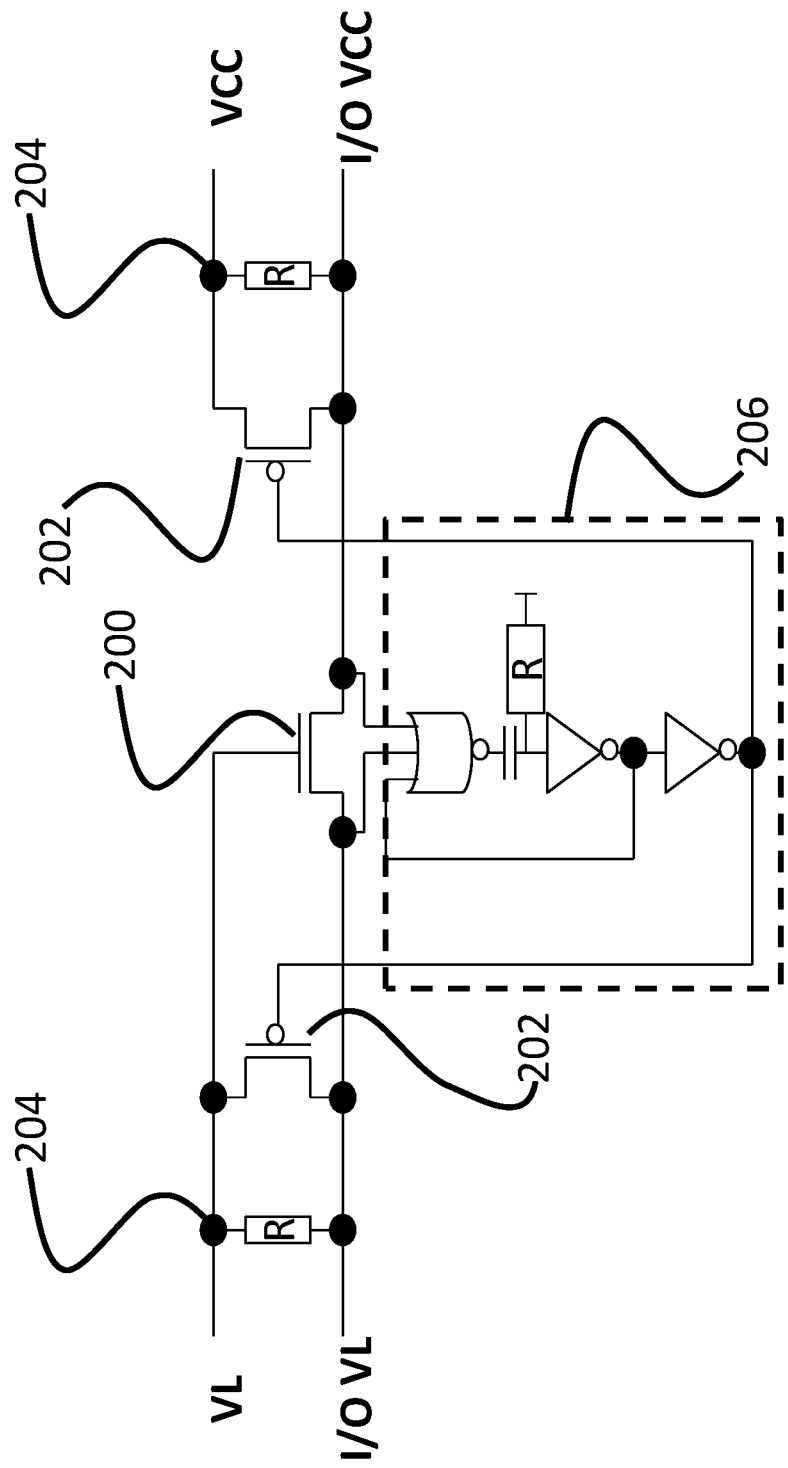
FIG. 2 is a schematic depicting a design for a level shifter circuit that supports bi-directional level shifting for lower speed interfaces, in accordance with embodiments of the present disclosure.

Now referring to FIG. 2, a schematic for a level shifter circuit that supports bi-directional level shifting for lower speed interfaces is shown, in accordance with embodiments of the present disclosure. More specifically, the design includes a lower logic voltage (VL) supply, an input/output (I/O) VL signal pin, a higher logic voltage (VCC) supply, and an input/output (I/O) VCC signal pin.

In embodiments, VL is configured to be connected to a lower voltage (e.g. 1.8V, 2.5V, or 3.3V) source, dependent on design requirements. In embodiments, VCC is configured to be connected to a higher voltage (e.g. 3.3 v) source.

The VL supply and I/O VL signal pin and VCC supply and I/O VCC signal pin are bridged by pull-up resistors 204 while the I/O VL and I/O VCC pins are connected to a pass-gate configured NMOS transistor 200. This NMOS pass-gate 200 reduces the voltage level of a signal driven from the VCC supply voltage to the voltage level of the VL supply voltage.

The pull-up resistors 204 of embodiments are located on opposing sides of the NMOS pass-gate 200 and function to restore full VL and VCC voltages on their respective side of the NMOS pass-gate 200 and increase the voltage level of a signal driven from the VL supply voltage to the voltage level of the VCC supply voltage. The pull-up resistors 204 of embodiments are constructed using PMOS transistors and implemented using a cold spare tolerant output driver circuit topology. The use of pull-up resistors 204 as described herein allows the level shifter circuit to support open drain signaling and reduces the number of board components needed in many applications.

In embodiments, the design also provides pull-up assist circuitry 202 to improve open drain rise transition times. The pull-up assist circuitry 202 of embodiments are constructed using PMOS transistors and implemented using a cold spare tolerant output driver circuit topology. These PMOS transistors act as pull-up assists during logic0 to logic1 signal transitions. In embodiments, the pull-up assist circuit 202 is low impedance and is enabled for short durations to overcome the RC time constant (also called tau) limitation of prior art circuits, such as that shown in FIG. 1. This decreases the signal transition time, thus allowing higher performance operation and larger capacitive loads.

Finally, the NMOS pass-gate 200 is connected to a one-shot circuit 206 that is configured to detect logic0 to logic1 transitions and to generate a pulse in response thereto that is configured to activate the pull-up assist circuitry 202 for a specified duration. The duration of pull-up assist circuitry 202 activation is determined by the one-shot circuit's 206 RC time constant, which is also commonly referred to as tau.

This design topology allows for use in open drain applications while remaining compatible with standard Low Voltage Complementary Metal Oxide Semiconductor (LVCMOS) operation. Furthermore, this design topology supports cold spare operation and bi-directional signaling without needing external direction control input signals.

Figure 3:
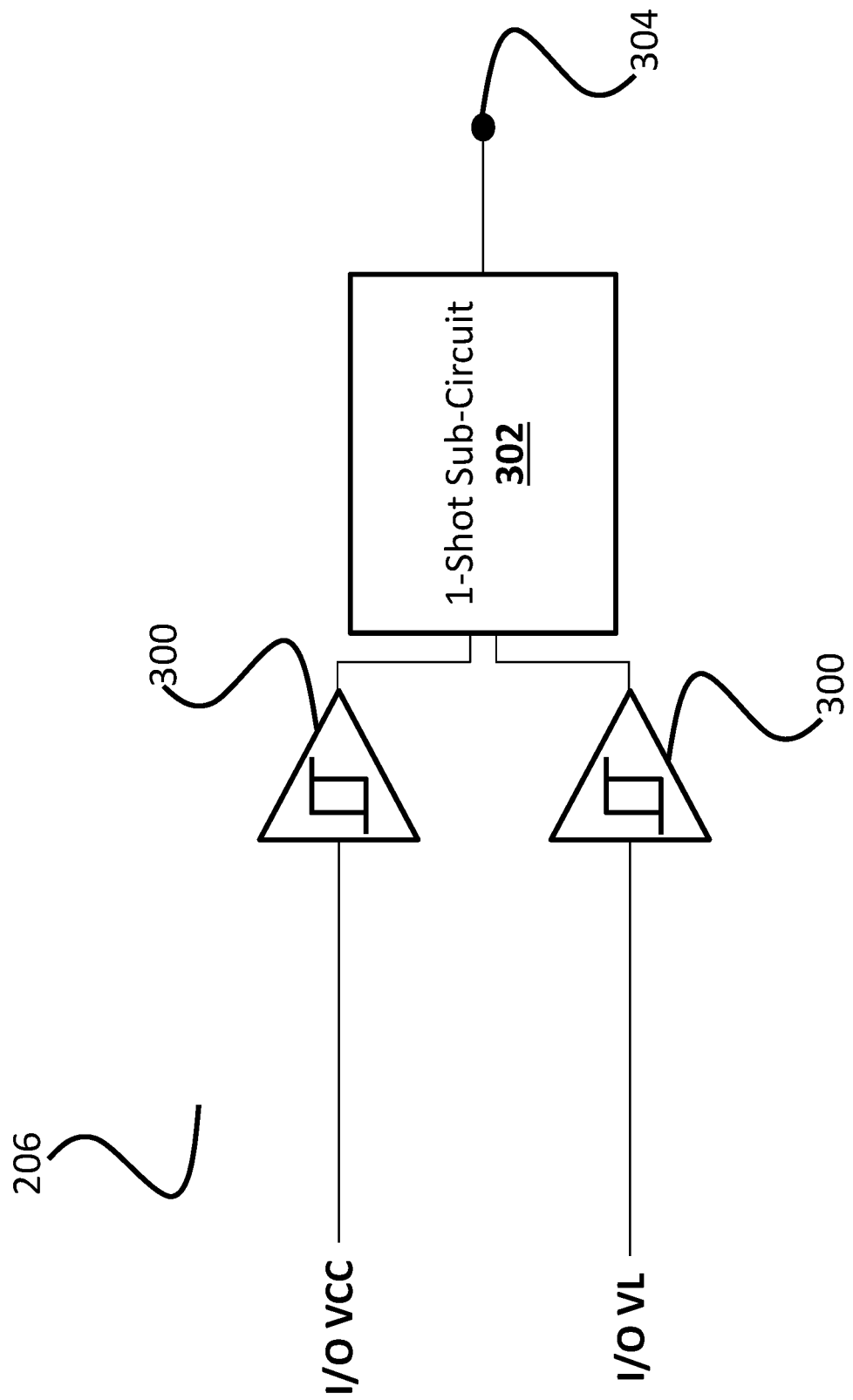
FIG. 3 is a schematic showing a radiation hardened one-shot circuit, in accordance with embodiments of the present disclosure.

FIG. 3 provides a schematic further describing the one-shot circuit 206 used in embodiments of the level shifter circuit of FIG. 2. More specifically, FIG. 3 shows Schmitt trigger input receivers 300 disposed between I/O VCC and I/O VL and separate inputs of a one-shot sub-circuit 302. Schmitt trigger, in this context, should be understood to refer to a receiver circuit with hysteresis used to filter input noise from signals with long transition times.

Furthermore, as previously discussed, the one-shot circuit 206 is configured to detect logic0 to logic1 transitions and also comprises an output 304 in communication with the pull-up assist circuits 202. The one-shot circuit 206 is configured to generate a pulse on its output 304 in response to a detected transition, with the pulse being configured to activate the pull-up assist circuitry 202 for a specified duration. The duration of pull-up assist circuitry 202 activation is determined by the circuit's RC time constant.

Figure 4:
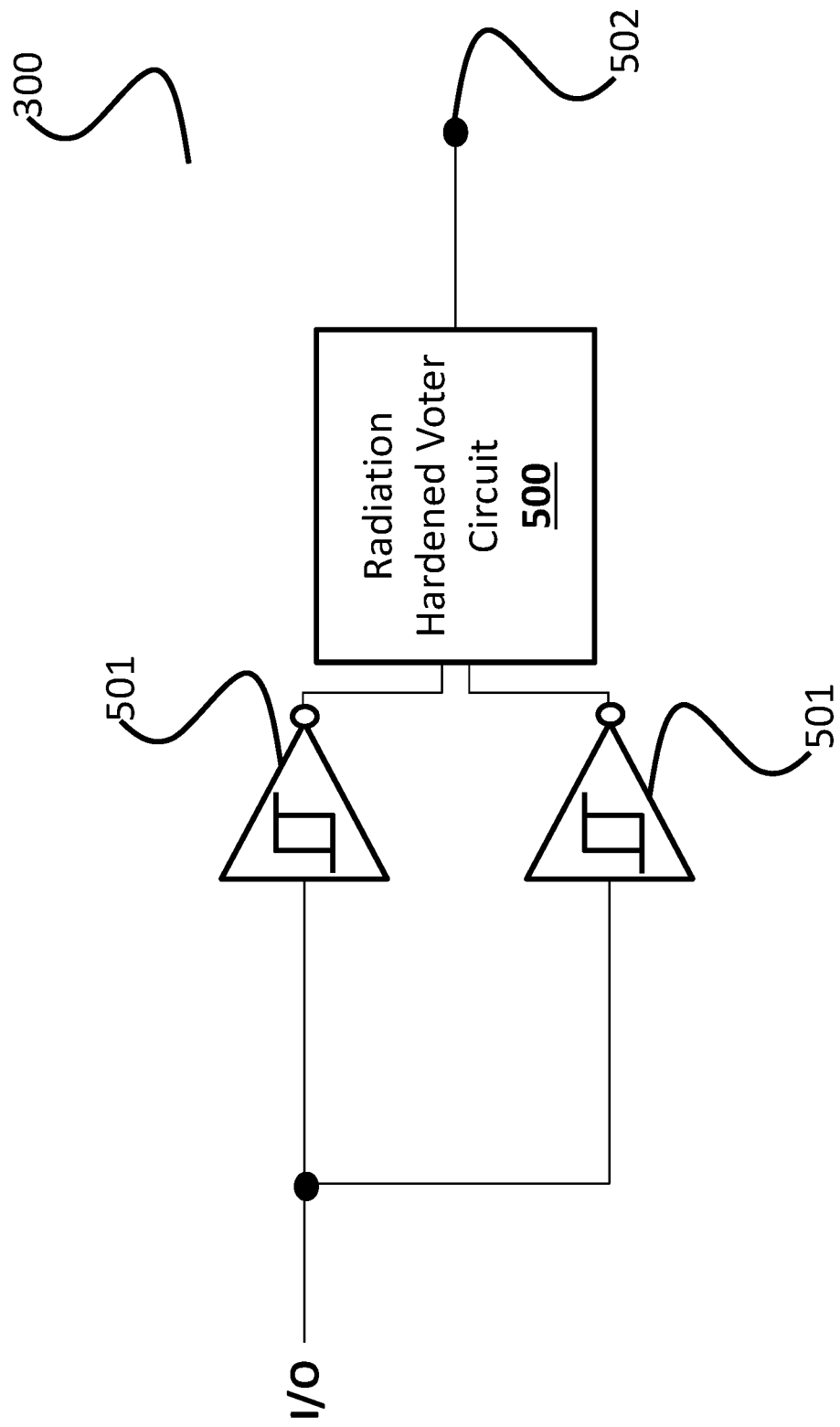
FIG. 4 is a schematic showing a radiation hardened Schmitt trigger receiver, in accordance with embodiments of the present disclosure.

Now referring to FIG. 4, a schematic describing the structure of the Schmitt trigger input receiver 300 used in the circuit of FIG. 3 is depicted. In embodiments, the receiver comprises an input in communication with two Schmitt trigger circuits 501 that are in further communication with a radiation hardened voter circuit 500 that further comprises an output 502. The Schmitt trigger input receiver 300, in embodiments, utilizes a dual-path design for radiation hardening. In embodiments, the receiver is designed to mitigate issues with long input transition times.

Figure 5:
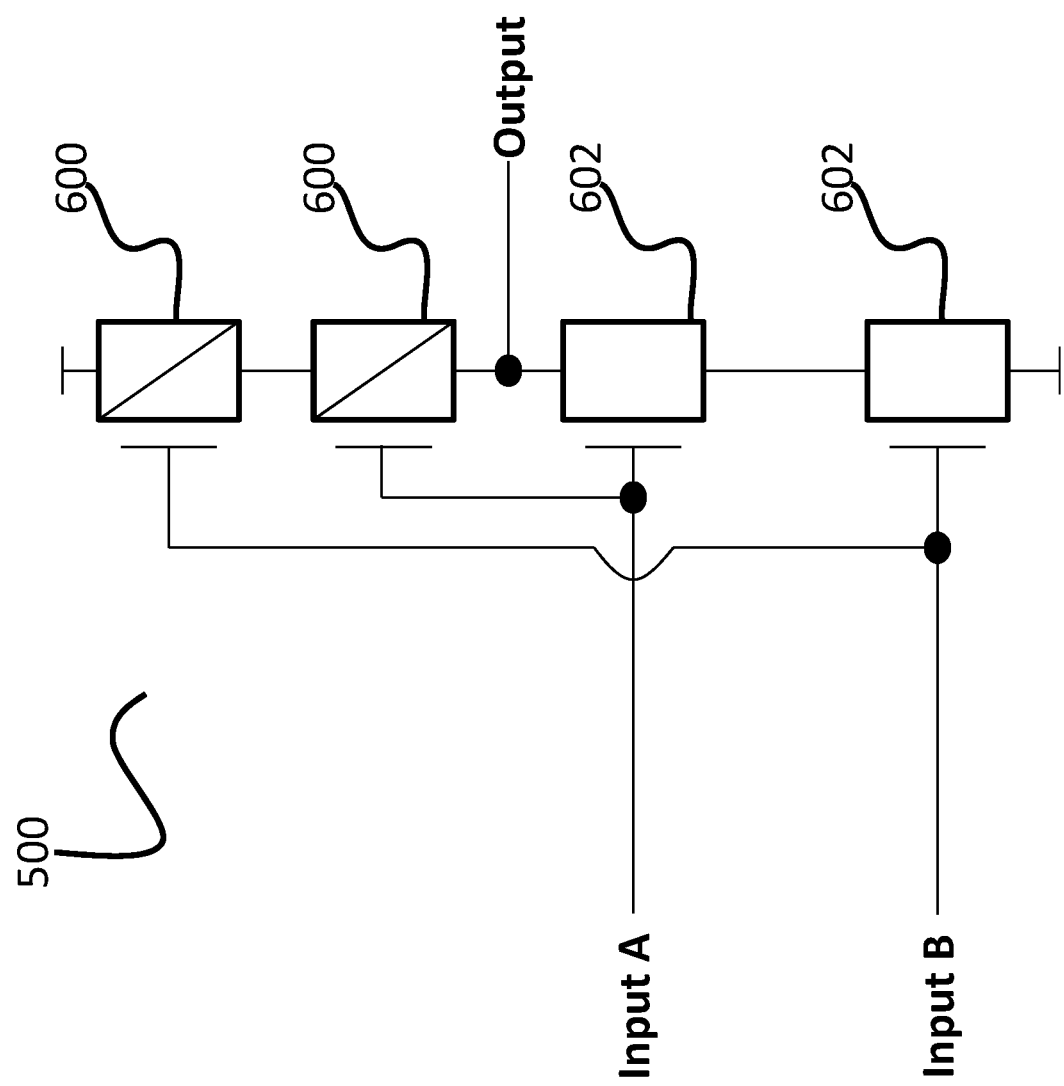
FIG. 5 is a schematic showing a radiation hardened voter circuit, in accordance with embodiments of the present disclosure.
Figure 6:
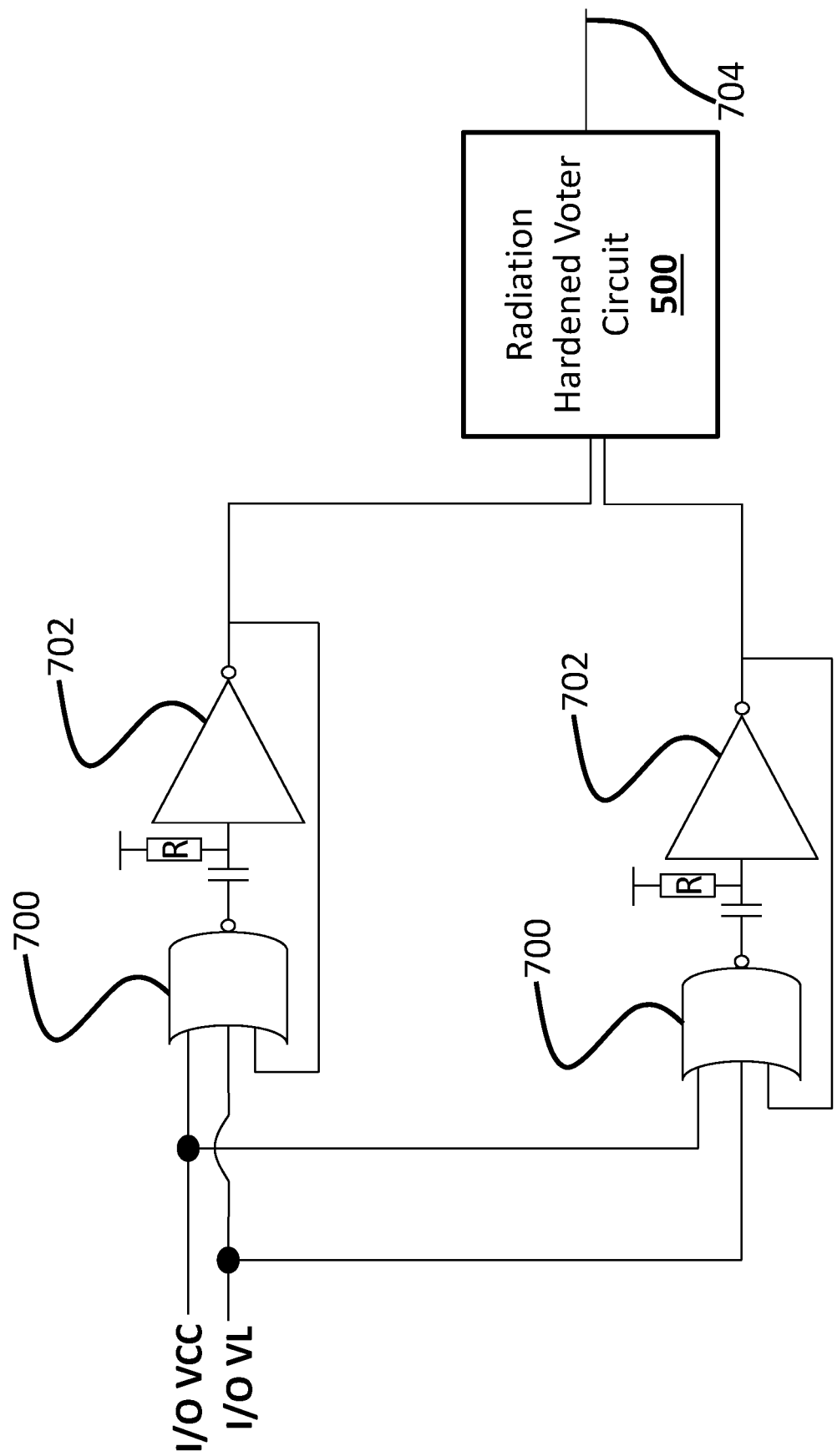
FIG. 6 is a schematic showing a radiation hardened one-shot, in accordance with embodiments of the present disclosure.

FIG. 5 is a schematic showing details of the radiation hardened voter circuit of FIGS. 4 and 6. In FIG. 5, input a and input b are each shown in communication with one PMOS transistor 600 and one NMOS transistor 602 each, with all transistors connected in a stacked inverter configuration. When input a and input b are both logic0 output is logic1. When input a and input b are both logic1, output is logic0. When input a and input b are at different logic states, output is high impedance and thus does not change state. This circuit, when combined with dual-path input logic, is capable of filtering temporary logic state changes on one of the input paths, such as those caused by charged particles in radiation environments.

FIG. 6 provides a schematic describing the structure of the radiation hardened one-shot sub-circuit 302 used in embodiments of the level shifter circuit shown in FIGS. 2 and 3. In embodiments, the one-shot sub-circuit 302 of embodiments utilizes passive resistive and capacitive elements to determine the output pulse width for a logic0 to logic1 input transition on either the I/O VL or I/O VCC input pin. In embodiments, the one-shot sub-circuit 302 comprises one NOR Gate 700 and one NOT Gate 702 (ANSI symbols are used in the Figures), with the output of the NOR Gate 700 connected to the input of the NOT Gate 702, which includes the passive pull-up resistor, via the passive capacitor. The output of the NOT Gate 702 is fed back to the input of the NOR Gate 700, and also to the pull-up assist circuitry 202, via output 704.

In embodiments, the one-shot sub-circuit 302 uses a Schmitt trigger 300 inverter for noise rejection due to RC transition time.

In embodiments, the one-shot sub-circuit 302 utilizes a dual-path design for radiation hardening. In such designs, the output of the NOT Gates 702 are used as inputs to a radiation hardened voter circuit 500 configured to allow the one-shot circuit 206 to continue to function in the presence of a temporary fault in one of the of the two logic paths.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A level shifting circuit, the circuit comprising:
   a first input configured to be connected to a first lower voltage source (VL);
   a first input/output connection referenced to the first lower voltage source (I/O VL);
   a second input configured to be connected to a second higher voltage source (VCC);
   a second input/output connection referenced to the second higher voltage source (I/O VCC);
   a first pull-up resistor disposed between the first input and the first input/output connection;
   a second pull-up resistor disposed between the second input and the second input/output connection;
   a first pull-up assist circuit comprising a first pull-up assist p-channel MOSFET having a source/body, drain, and gate, the source/body and drain being connected to the first input and first input/output connection, respectively;
   a second pull-up assist circuit comprising a second pull-up assist p-channel MOSFET having a source/body, drain, and gate, the source/body and drain being connected to the second input and second input/output connection;
   a pass-gate n-channel MOSFET in operative communication with the first input/output connection, the second input/output connection, and the first input, the pass-gate being configured to reduce the voltage level of a signal driven from the second input/output connection to the voltage level of the first input/output connection;
   a one-shot circuit configured to detect a first or second input/output connection transition from a low state to a high state, to produce a pulse in response thereto, and to communicate that pulse to the gates of the first and second pull-up assist p-channel MOSFETs,
   wherein the second pull-up resistor is configured to increase the voltage level of a signal driven from the first input/output connection to the voltage level of the second input/output connection; and
   a Schmitt trigger circuit disposed between the first and second input/output connections and the one-shot circuit.

2. The level shifting circuit of claim 1 wherein the Schmitt trigger circuit is a multipath design.

3. The level shifting circuit of claim 2 wherein the Schmitt trigger circuit comprises a voter circuit configured to determine the correct output when different paths of the multipath design result in different outcomes.

4. The level shifting circuit of claim 1 wherein the first and second pull-up assist circuits are implemented using a cold spare tolerant circuit topology.

5. The level shifting circuit of claim 1 wherein the first and second pull-up resistors are implemented using a cold spare tolerant circuit topology.

6. The level shifting circuit of claim 1 wherein the one-shot circuit is a multipath design.

7. The level shifting circuit of claim 6 wherein the one-shot circuit comprises a voter circuit configured to determine the correct output when different paths of the multipath design result in different outcomes.

8. A level shifting circuit, the circuit comprising:
   a first input configured to be connected to a first lower voltage source (VL);
   a first input/output connection referenced to the first lower voltage source (I/O VL);
   a second input configured to be connected to a second higher voltage source (VCC);
   a second input/output connection referenced to the second higher voltage source (I/O VCC);
   a first pull-up resistor disposed between the first input and the first input/output connection;
   a second pull-up resistor disposed between the second input and the second input/output connection;
   a first pull-up assist circuit comprising a first pull-up assist p-channel MOSFET having a source/body, drain, and gate, the source/body and drain being connected to the first input and first input/output connection, respectively;
   a second pull-up assist circuit comprising a second pull-up assist p-channel MOSFET having a source/body, drain, and gate, the source/body and drain being connected to the second input and second input/output connection;
   a pass-gate n-channel MOSFET in operative communication with the first input/output connection, the second input/output connection, and the first input, the pass-gate being configured to reduce the voltage level of a signal driven from the second input/output connection to the voltage level of the first input/output connection; and
   a one-shot circuit configured to detect a first or second input/output connection transition from a low state to a high state, to produce a pulse in response thereto, and to communicate that pulse to the gates of the first and second pull-up assist p-channel MOSFETs,
   wherein the second pull-up resistor is configured to increase the voltage level of a signal driven from the first input/output connection to the voltage level of the second input/output connection,
   wherein the first and second pull-up assist circuits are implemented using a cold spare tolerant circuit topology,
   wherein the first and second pull-up resistors are implemented using a cold spare tolerant circuit topology; and a Schmitt trigger circuit disposed between the first and second input/output connections and the one-shot circuit.

9. A level shifting circuit, the circuit comprising:

a first input configured to be connected to a first lower voltage source (VL);

a first input/output connection referenced to the first lower voltage source (I/O VL);

a second input configured to be connected to a second higher voltage source (VCC);

a second input/output connection referenced to the second higher voltage source (I/O VCC);

a first pull-up resistor disposed between the first input and the first input/output connection;

a second pull-up resistor disposed between the second input and the second input/output connection;

a first pull-up assist circuit comprising a first pull-up assist p-channel MOSFET having a source/body, drain, and gate, the source/body and drain being connected to the first input and first input/output connection, respectively;

a second pull-up assist circuit comprising a second pull-up assist p-channel MOSFET having a source/body, drain, and gate, the source/body and drain being connected to the second input and second input/output connection;

a pass-gate n-channel MOSFET in operative communication with the first input/output connection, the second input/output connection, and the first input, the pass-gate being configured to reduce the voltage level of a signal driven from the second input/output connection to the voltage level of the first input/output connection;

a one-shot circuit configured to detect a first or second input/output connection transition from a low state to a high state, to produce a pulse in response thereto, and to communicate that pulse to the gates of the first and second pull-up assist p-channel MOSFETs; and a Schmitt trigger circuit disposed between the first and second input/output connections and the one-shot circuit, the Schmitt trigger circuit being a multipath design and comprising a voter circuit configured to determine the correct output when different paths of the multipath design result in different outcomes, wherein the second pull-up resistor is configured to increase the voltage level of a signal driven from the first input/output connection to the voltage level of the second input/output connection, wherein the first and second pull-up assist circuits are implemented using a cold spare tolerant circuit topology, wherein the first and second pull-up resistors are implemented using a cold spare tolerant circuit topology, and wherein the one-shot circuit is a multipath design and comprises a voter circuit configured to determine the correct output when different paths of the multipath design result in different outcomes.

* * * * *